(12) United States Patent
Eldershaw

(10) Patent No.: US 7,630,200 B1
(45) Date of Patent: Dec. 8, 2009

(54) ELECTRONIC DEVICE AND TACTILE TOUCH SCREEN DISPLAY

(75) Inventor: Michael Keith Eldershaw, Oakville (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

(21) Appl. No.: 12/129,165

(22) Filed: May 29, 2008

(51) Int. Cl.
G06F 1/16 (2006.01)

(52) U.S. Cl. .................. 361/679.57; 235/386; 715/738; 345/167; 463/25

(58) Field of Classification Search .................. 235/386, 235/381, 383; 400/624; 455/348; 715/835, 715/738, 202, 764; 345/173, 167, 168; 463/16, 463/25, 30; 361/679.06, 679.21, 679.27, 361/679.57

See application file for complete search history.

(56) References Cited

U.S. PATENT DOCUMENTS

| 2006/0024117 | A1* | 2/2006 | Sawai et al. ............... 400/624 |
| 2007/0087725 | A1* | 4/2007 | Anderson .................. 455/348 |
| 2008/0034294 | A1 | 2/2008 | Ronkainen et al. |
| 2008/0116270 | A1* | 5/2008 | Wilson et al. .............. 235/386 |
| 2008/0308634 | A1* | 12/2008 | Bolton et al. .............. 235/386 |

FOREIGN PATENT DOCUMENTS

| EP | 0419145 A1 | 3/1991 |
| EP | 1691263 A1 | 8/2006 |
| GB | 902766 | 8/1962 |
| GB | 1245244 | 9/1971 |
| GB | 2402105 | 12/2004 |
| JP | 63053757 | 3/1988 |
| WO | 2004107146 A2 | 12/2004 |

OTHER PUBLICATIONS

European Patent Application No. 08157228.1 Search Report dated Mar. 4, 2009.

* cited by examiner

Primary Examiner—Hung V Duong
(74) Attorney, Agent, or Firm—Geoffrey deKleine; Borden Ladner Gervais LLP

(57) ABSTRACT

An electronic device includes a housing having a back, a support tray moveable relative to the back of the housing, a touch-sensitive display supported by the support tray and moveable with the support tray relative to the back of the housing, the touch-sensitive display including a display device and a touch-sensitive overlay disposed on the display device, a locking arrangement cooperating with the support tray for locking the support tray and touch-sensitive display to inhibit movement of the support tray relative to the back of the housing, and operational components housed in the housing and including a touch screen controller connected to the touch-sensitive overlay and a processor connected to the display device and the touch-screen controller.

27 Claims, 12 Drawing Sheets

ELECTRONIC DEVICE AND TACTILE TOUCH SCREEN DISPLAY

FIELD OF TECHNOLOGY

The present disclosure relates to a touch screen display and an electronic device with a touch-sensitive input screen that is moveable relative to a base of the electronic device for providing tactile feedback when in use.

BACKGROUND

Electronic devices, including portable electronic devices, have gained widespread use and can provide a variety of functions including, for example, telephonic, electronic messaging and other personal information manager (PIM) application functions. Portable electronic devices can include several types of devices including mobile stations such as simple cellular telephones, smart telephones, wireless PDAs, and laptop computers with wireless 802.11 or Bluetooth capabilities. These devices run on a wide variety of networks from data-only networks such as Mobitex and DataTAC to complex voice and data networks such as GSM/GPRS, CDMA, EDGE, UMTS and CDMA2000 networks.

Devices such as PDAs or smart telephones are generally intended for handheld use and easy portability. Smaller devices are generally desirable for portability. A touch screen input/output device is particularly useful on such handheld devices as such handheld devices are small and are therefore limited in space available for user input and output devices. Further, the screen content on the touch screen devices can be modified depending on the functions and operations being performed.

Touch screen devices include a display, such as a liquid crystal display, with a touch-sensitive overlay exposed for input and output. These touch screen devices suffer from inherent disadvantages relating to user interaction and response, however. For example, such touch screen devices fail to provide user-desirable tactile feedback for positively indicating input. Poor or no tactile feedback causes difficulty in discerning whether or not an intended input has been received and can result in receipt of erroneous input at the device, for example, by additional or double input. Electronic devices with a moveable touch screen display relative to a base of the device can provide tactile feedback to user. These devices are intended to provide tactile feedback in response to a force applied to the touch screen display. Further improvements for tactile feedback and control of such feedback are desirable, however.

BRIEF DESCRIPTION OF THE DRAWINGS

Embodiments of the present disclosure will now be described, by way of example only, with reference to the attached Figures, wherein.

DETAILED DESCRIPTION

Figure 1:
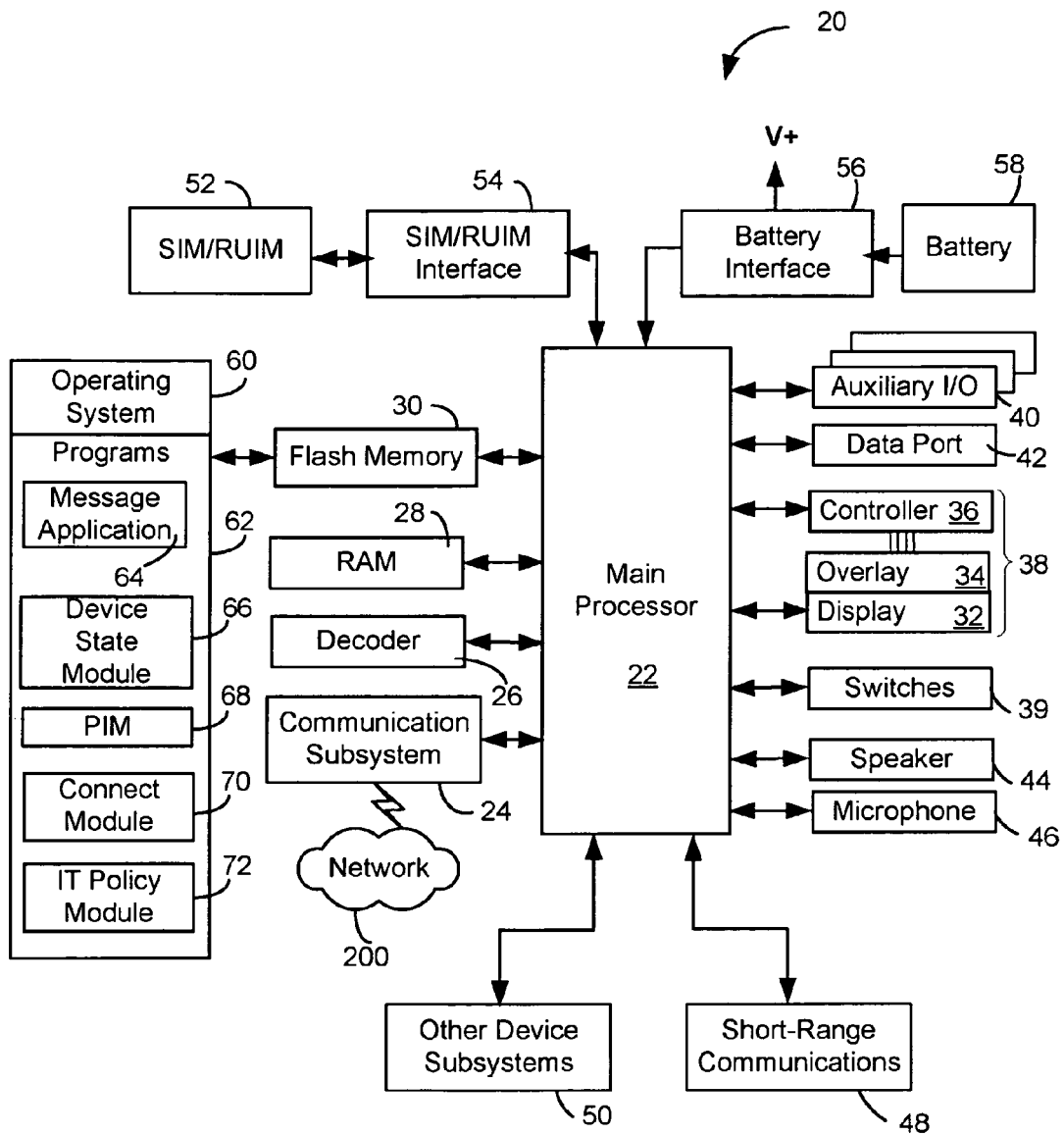
FIG. 1 is a simplified block diagram of components of a portable electronic device according an embodiment.

It will be appreciated that for simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limited to the scope of the embodiments described herein.

The present disclosure generally relates to an electronic device, which in the embodiments described herein is a portable electronic device. Examples of portable electronic devices include mobile, or handheld, wireless communication devices such as pagers, cellular phones, cellular smartphones, wireless organizers, personal digital assistants, wirelessly enabled notebook computers and the like.

The portable electronic device may be a two-way communication device with advanced data communication capabilities including the capability to communicate with other portable electronic devices or computer systems through a network of transceiver stations. The portable electronic device may also have the capability to allow voice communication. Depending on the functionality provided by the portable electronic device, it may be referred to as a data messaging device, a two-way pager, a cellular telephone with data messaging capabilities, a wireless Internet appliance, or a data communication device (with or without telephony capabilities). The portable electronic device may also be a portable device without wireless communication capabilities as a handheld electronic game device, digital photograph album, digital camera and the like.

Reference is first made to FIG. 1, which shows a block diagram of an exemplary embodiment of a portable electronic device 20. The portable electronic device 20 includes a number of components such as the processor 22 that controls the overall operation of the portable electronic device 20. Communication functions, including data and voice communications, are performed through a communication subsystem 24. Data received by the portable electronic device 20 can be decompressed and decrypted by a decoder 26, operating according to any suitable decompression techniques (e.g. YK decompression, and other known techniques) and encryption techniques (e.g. using an encryption technique such as Data Encryption Standard (DES), Triple DES, or Advanced Encryption Standard (AES)). The communication subsystem 24 receives messages from and sends messages to a wireless network 200. In this exemplary embodiment of the portable electronic device 20, the communication subsystem 24 is configured in accordance with the Global System for Mobile Communication (GSM) and General Packet Radio Services (GPRS) standards. The GSM/GPRS wireless network is used worldwide and it is expected that these standards will be superseded eventually by Enhanced Data GSM Environment (EDGE) and Universal Mobile Telecommunications Service (UMTS). New standards are still being defined, but it is believed that they will have similarities to the network behavior described herein, and it will also be understood by persons skilled in the art that the embodiments described herein are intended to use any other suitable standards that are developed in the future. The wireless link connecting the communication subsystem 24 with the wireless network 200 represents one or more different Radio Frequency (RF) channels, operating according to defined protocols specified for GSM/GPRS communications. With newer network protocols, these channels are capable of supporting both circuit switched voice communications and packet switched data communications.

Although the wireless network 200 associated with the portable electronic device 20 is a GSM/GPRS wireless network in one exemplary implementation, other wireless networks may also be associated with the portable electronic device 20 in variant implementations. The different types of wireless networks that may be employed include, for example, data-centric wireless networks, voice-centric wireless networks, and dual-mode networks that can support both voice and data communications over the same physical base stations. Combined dual-mode networks include, but are not limited to, Code Division Multiple Access (CDMA) or CDMA1000 networks, GSM/GPRS networks (as mentioned above), and future third-generation (3G) networks like EDGE and UMTS. Some other examples of data-centric networks include WiFi 802.11, Mobitex™ and DataTAC™ network communication systems. Examples of other voice-centric data networks include Personal Communication Systems (PCS) networks like GSM and Time Division Multiple Access (TDMA) systems.

The processor 22 also interacts with additional subsystems such as a Random Access Memory (RAM) 28, a flash memory 30, a display 32 with a touch-sensitive overlay 34 connected to an electronic controller 36 that together are part of a touch screen display 38, switches 39 for providing additional input in combination with the touch screen display 38, an auxiliary input/output (I/O) subsystem 40, a data port 42, a speaker 44, a microphone 46, short-range communications 48 and other device subsystems 50. The touch-sensitive overlay 34 and the display 38 provide a touch-sensitive display device and the processor 22 interacts with the touch-sensitive overlay 34 via the electronic controller 36.

Some of the subsystems of the portable electronic device 20 perform communication-related functions, whereas other subsystems may provide "resident" or on-device functions. By way of example, the display 32 and the touch-sensitive overlay 34 may be used for both communication-related functions, such as entering a text message for transmission over the network 200, and device-resident functions such as a calculator or task list.

The portable electronic device 20 can send and receive communication signals over the wireless network 200 after network registration or activation procedures have been completed. Network access is associated with a subscriber or user of the portable electronic device 20. To identify a subscriber according to the present embodiment, the portable electronic device 20 uses a SIM/RUIM card 52 (i.e. Subscriber Identity Module or a Removable User Identity Module) inserted into a SIM/RUIM interface 54 for communication with a network such as the network 200. The SIM/RUIM card 52 is one type of a conventional "smart card" that can be used to identify a subscriber of the portable electronic device 20 and to personalize the portable electronic device 20, among other things. In the present embodiment the portable electronic device 20 is not fully operational for communication with the wireless network 200 without the SIM/RUIM card 52. By inserting the SIM/RUIM card 52 into the SIM/RUIM interface 54, a subscriber can access all subscribed services. Services may include: web browsing and messaging such as e-mail, voice mail, Short Message Service (SMS), and Multimedia Messaging Services (MMS). More advanced services may include: point of sale, field service and sales force automation. The SIM/RUIM card 52 includes a processor and memory for storing information. Once the SIM/RUIM card 52 is inserted into the SIM/RUIM interface 54, it is coupled to the processor 22. In order to identify the subscriber, the SIM/RUIM card 52 can include some user parameters such as an International Mobile Subscriber Identity (IMSI). An advantage of using the SIM/RUIM card 52 is that a subscriber is not necessarily bound by any single physical portable electronic device. The SIM/RUIM card 52 may store additional subscriber information for a portable electronic device as well, including datebook (or calendar) information and recent call information. Alternatively, user identification information can also be programmed into the flash memory 30.

The portable electronic device 20 is a battery-powered device and includes a battery interface 56 for receiving one or more rechargeable batteries 58. In at least some embodiments, the battery 58 can be a smart battery with an embedded microprocessor. The battery interface 56 is coupled to a regulator (not shown), which assists the battery 58 in providing power V+ to the portable electronic device 20. Although current technology makes use of a battery, future technologies such as micro fuel cells may provide the power to the portable electronic device 20.

The portable electronic device 20 also includes an operating system 60 and software components 62 to 72 which are described in more detail below. The operating system 60 and the software components 62 to 72 that are executed by the processor 22 are typically stored in a persistent store such as the flash memory 30, which may alternatively be a read-only memory (ROM) or similar storage element (not shown). Those skilled in the art will appreciate that portions of the operating system 60 and the software components 62 to 72, such as specific device applications, or parts thereof, may be temporarily loaded into a volatile store such as the RAM 28. Other software components can also be included, as is well known to those skilled in the art.

The subset of software applications 62 that control basic device operations, including data and voice communication applications, will normally be installed on the portable electronic device 20 during its manufacture. Other software applications include a message application 64 that can be any suitable software program that allows a user of the portable electronic device 20 to send and receive electronic messages. Various alternatives exist for the message application 64 as is well known to those skilled in the art. Messages that have been sent or received by the user are typically stored in the flash memory 30 of the portable electronic device 20 or some other suitable storage element in the portable electronic device 20. In at least some embodiments, some of the sent and received messages may be stored remotely from the device 20 such as in a data store of an associated host system that the portable electronic device 20 communicates with.

The software applications can further include a device state module 66, a Personal Information Manager (PIM) 68, and other suitable modules (not shown). The device state module 66 provides persistence, i.e. the device state module 66 ensures that important device data is stored in persistent memory, such as the flash memory 30, so that the data is not lost when the portable electronic device 20 is turned off or loses power.

The PIM 68 includes functionality for organizing and managing data items of interest to the user, such as, but not limited to, e-mail, contacts, calendar events, voice mails, appointments, and task items. A PIM application has the ability to send and receive data items via the wireless network 200. PIM data items may be seamlessly integrated, synchronized, and updated via the wireless network 200 with the portable electronic device subscriber's corresponding data items stored and/or associated with a host computer system. This functionality creates a mirrored host computer on the portable electronic device 20 with respect to such items. This can be particularly advantageous when the host computer system is the portable electronic device subscriber's office computer system.

The portable electronic device 20 also includes a connect module 70, and an information technology (IT) policy module 72. The connect module 70 implements the communication protocols that are required for the portable electronic device 20 to communicate with the wireless infrastructure and any host system, such as an enterprise system, that the portable electronic device 20 is authorized to interface with.

The connect module 70 includes a set of APIs that can be integrated with the portable electronic device 20 to allow the portable electronic device 20 to use any number of services associated with the enterprise system. The connect module 70 allows the portable electronic device 20 to establish an end-to-end secure, authenticated communication pipe with the host system. A subset of applications for which access is provided by the connect module 70 can be used to pass IT policy commands from the host system to the portable electronic device 20. This can be done in a wireless or wired manner. These instructions can then be passed to the IT policy module 72 to modify the configuration of the device 20. Alternatively, in some cases, the IT policy update can also be done over a wired connection.

Other types of software applications can also be installed on the portable electronic device 20. These software applications can be third party applications, which are added after the manufacture of the portable electronic device 20. Examples of third party applications include games, calculators, utilities, etc.

The additional applications can be loaded onto the portable electronic device 20 through at least one of the wireless network 200, the auxiliary I/O subsystem 40, the data port 42, the short-range communications subsystem 48, or any other suitable device subsystem 50. This flexibility in application installation increases the functionality of the portable electronic device 20 and may provide enhanced on-device functions, communication-related functions, or both. For example, secure communication applications may enable electronic commerce functions and other such financial transactions to be performed using the portable electronic device 20.

The data port 42 enables a subscriber to set preferences through an external device or software application and extends the capabilities of the portable electronic device 20 by providing for information or software downloads to the portable electronic device 20 other than through a wireless communication network. The alternate download path may, for example, be used to load an encryption key onto the portable electronic device 20 through a direct and thus reliable and trusted connection to provide secure device communication.

The data port 42 can be any suitable port that enables data communication between the portable electronic device 20 and another computing device. The data port 42 can be a serial or a parallel port. In some instances, the data port 42 can be a USB port that includes data lines for data transfer and a supply line that can provide a charging current to charge the battery 58 of the portable electronic device 20.

The short-range communications subsystem 48 provides for communication between the portable electronic device 20 and different systems or devices, without the use of the wireless network 200. For example, the short-range communications subsystem 48 may include an infrared device and associated circuits and components for short-range communication. Examples of short-range communication standards include standards developed by the Infrared Data Association (IrDA), Bluetooth, and the 802.11 family of standards developed by IEEE.

In use, a received signal such as a text message, an e-mail message, or web page download is processed by the communication subsystem 24 and input to the processor 22. The processor 22 then processes the received signal for output to the display 32 or alternatively to the auxiliary I/O subsystem 40. A subscriber may also compose data items, such as e-mail messages, for example, using the touch-sensitive overlay 34 on the display 32 that are part of the touch screen display 38, and possibly the auxiliary I/O subsystem 40. The auxiliary subsystem 40 may include devices such as: a mouse, track ball, infrared fingerprint detector, or a roller wheel with dynamic button pressing capability. A composed item may be transmitted over the wireless network 200 through the communication subsystem 24.

For voice communications, the overall operation of the portable electronic device 20 is substantially similar, except that the received signals are output to the speaker 44, and signals for transmission are generated by the microphone 46. Alternative voice or audio I/O subsystems, such as a voice message recording subsystem, can also be implemented on the portable electronic device 20. Although voice or audio signal output is accomplished primarily through the speaker 44, the display 32 can also be used to provide additional information such as the identity of a calling party, duration of a voice call, or other voice call related information.

Reference is now made to the remaining Figures, which show various views of an exemplary portable electronic device 20, or portions thereof. The portable electronic device 20 includes a housing 80 having a back 82, a support tray 84 moveable relative to the back 82 of the housing 80, a touch-sensitive display 38 supported by the support tray 84 and moveable with the support tray 84 relative to the back 82 of the housing 80, the touch-sensitive display including the display device 32 and the touch-sensitive overlay 34 disposed on the display device 32. A locking arrangement cooperates with the support tray 84 for locking the support tray 84 and touch-sensitive display to inhibit movement of the support tray 84 relative to the back 82 of the housing 80. Operational components are housed in the housing and include a touch screen controller 36 connected to the touch-sensitive overlay 34 and a processor 22 connected to the display device 32 and the touch-screen controller 36.

Figure 2:
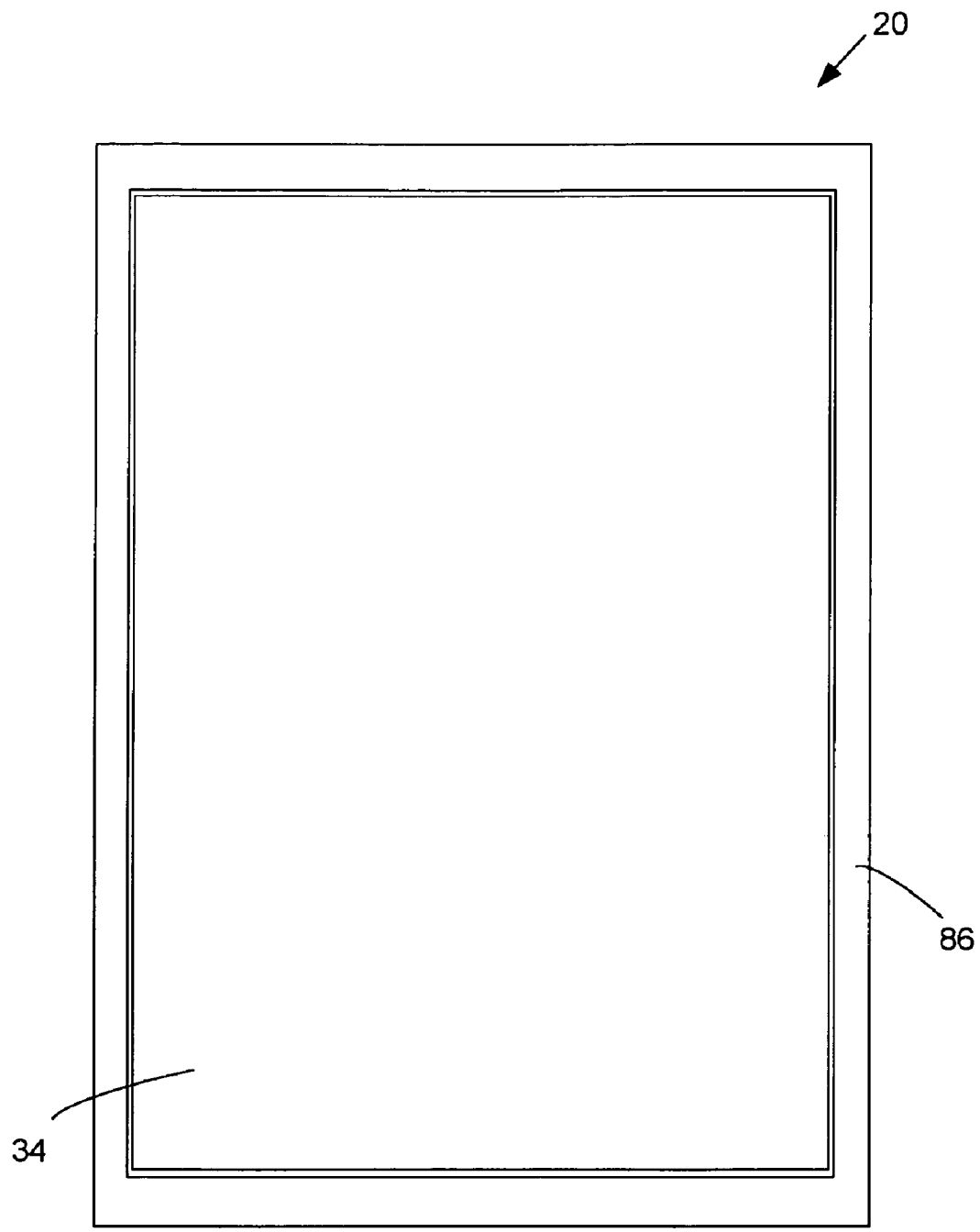
FIG. 2 is a top view of a portable electronic device according to an embodiment.
Figure 3:
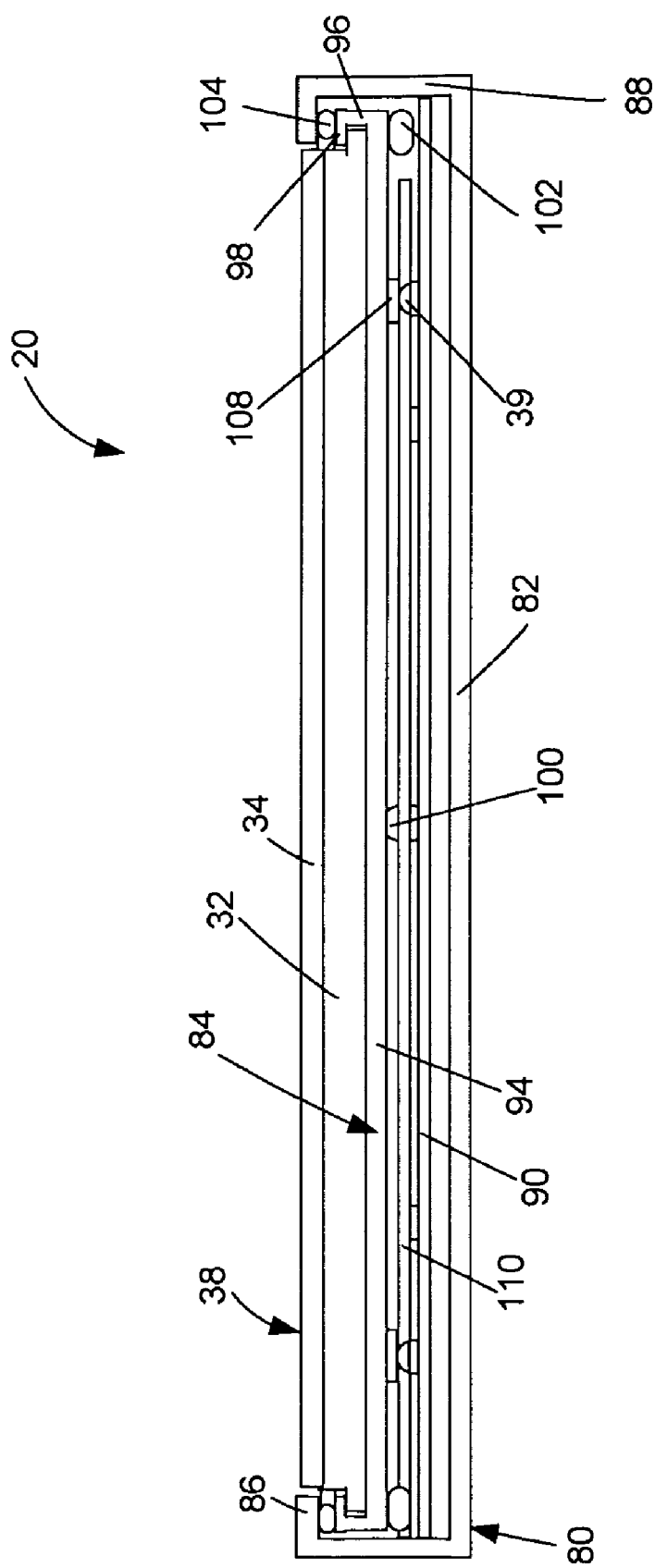
FIG. 3 is a simplified longitudinal cross-sectional side view through switches of the portable electronic device of FIG. 2.
Figure 4:
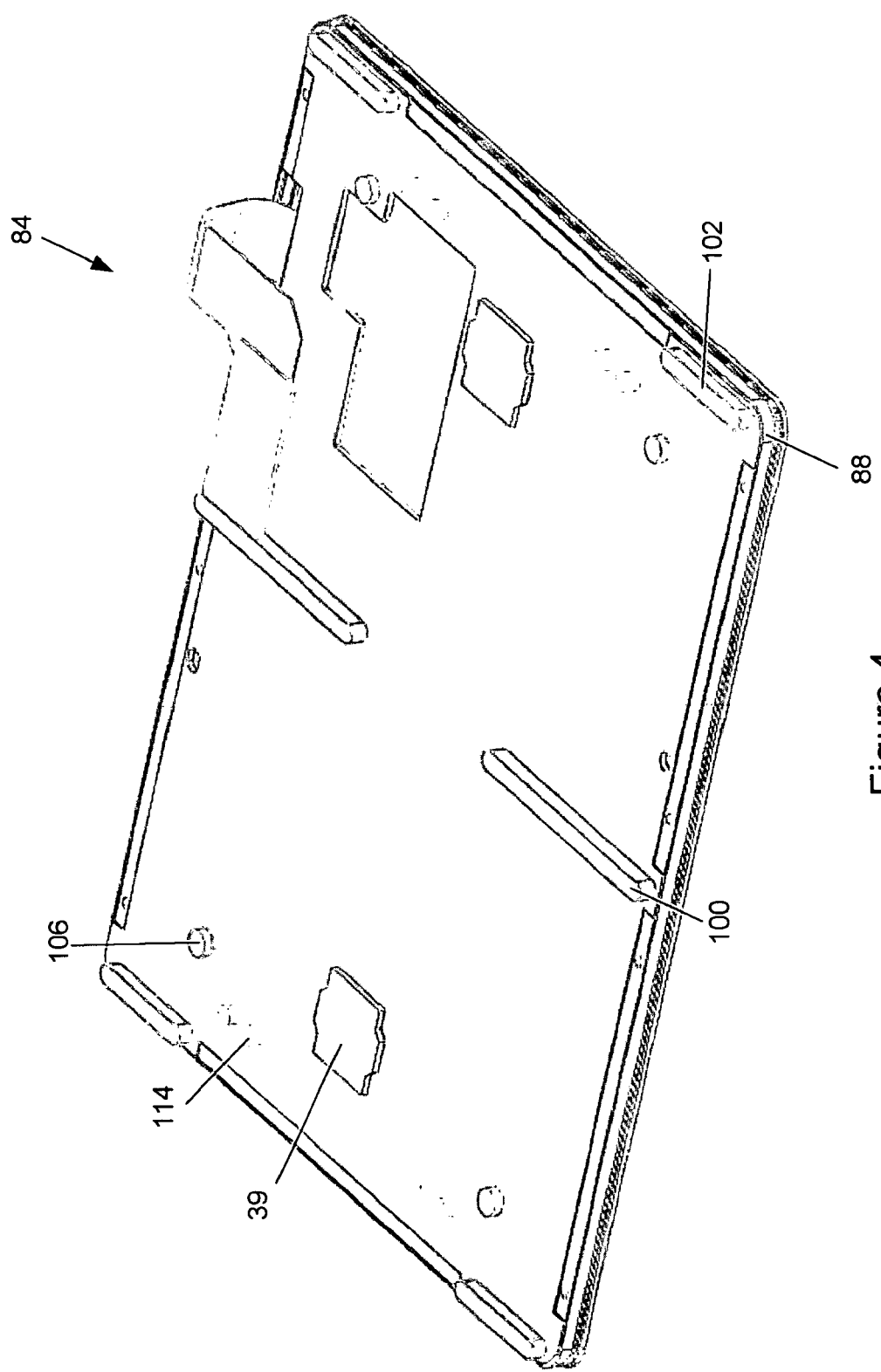
FIG. 4 is a perspective view of a support tray of the portable electronic device.

Reference is now made to FIGS. 2 to 4 to describe an embodiment of the tactile touch screen display for the portable electronic device 20. The portable electronic device 20 includes the housing 80 that houses the internal components shown in FIG. 1 and frames the touch screen display 38 such that the touch-sensitive overlay 34 is exposed for user interaction therewith when the portable electronic device 20 is in use. The housing 80 includes a back 82, the frame 86, which frames the touch screen display 38, sidewalls 88 that extend between and generally perpendicular to the back 82 and the frame 86, and a rigid base 90 that is spaced from and generally parallel to the back 82. The base 90 can be any suitable base and can include, for example, a printed circuit board or flex circuit board. The back 82 includes a plate (not shown) that is releasably attached for insertion and removal of, for example, the battery 58 and the SIM/RUIM card 52 described above. It will be appreciated that the back 82, the sidewalls 88 and the frame 86 can be injection molded, for example. According to the embodiment shown in FIG. 2, the frame 86 is generally rectangular although other shapes are possible. For example, the corners of the frame 86 can be rounded.

It will be appreciated that the touch screen display 38 is an assembly of components including, the touch-sensitive overlay 34 overlying the LCD display device 32 and other components including optional components such as a backlight (not shown). The touch-sensitive display portion of the touch screen display 38 is disposed on the support tray 84 for providing structural support and for inhibiting bending causing damage or breaking of the LCD display device 32 and the touch-sensitive overlay 34 and retained on the support tray 84 in a suitable manner such as by retaining clips. The support tray 84 along with the display device 32 and touch-sensitive overlay 34, are biased away from the base 90, toward the frame 86. The support tray 84 can be made from any suitable material such as magnesium. The support tray 84 includes the tray base 94 on which the touch-sensitive display, including the display device 32 and the touch-sensitive overlay 34, is seated. The support tray also includes tray sides 96 and the lip 98. The tray sides 96 extend away from the tray base 94, surrounding a portion of the edges of the LCD display device 32 and the touch-sensitive overlay 34, to protect and support the edges of the LCD display device 32 and the touch-sensitive overlay 34 and the lip 98 extends inwardly from each of the tray sides 96. In the portable electronic device 20, the lip 98 is located near the underside of the frame 86, between the frame 86 and the base 90, as shown in FIG. 3, such that the frame 86 maintains the support tray 84, the display device 32 and the touch-sensitive overlay 34 within the housing 80. Thus, the support tray 84, the display device 32 and the touch-sensitive overlay 34, together are moveable within and constrained by the housing 80.

The support tray 84 along with the display device 32 and the touch-sensitive overlay 34, are biased into the rest position shown in FIG. 3 at least partly by pivot gel pads 100, backside corner gel pads 102 and lip gel pads 104 as will be described further below. The support tray 84, the display device 32 and the touch-sensitive overlay 34 together are movable within the housing 80 as a force, for example, on any side of the touch-sensitive overlay 34 that is sufficient to overcome the bias, causes pivoting of the support tray 84 along with the display device 32 and the touch-sensitive overlay 34 about the pivot gel pads 100.

Two switches 39 (best shown in FIG. 3) are located between the base 90 and the tray base 94 for providing additional input and for providing tactile feedback to a user when pressing on the touch-sensitive overlay 34. The switches 39 can be any suitable switches, such as mechanical dome-type switches, located such that displacement of the support tray 84 along with the display device 32 and the touch-sensitive overlay 34 by pivoting about the pivot gel pads 100 resulting from a user pressing, for example, one side of the touch-sensitive overlay 34 with sufficient force to overcome the bias actuates a respective one of the switches 39. In the present embodiment, each one of the switches 39 is disposed on a respective side of center of the portable electronic device 20, proximal respective short ones of the sidewalls 88 with each switch 39 in contact with the support tray 84. Thus, displacement of the support tray 84 along with the display device 32 and the touch-sensitive overlay 34 as a result of user application of a force thereto causes actuation of a respective one of the switches 39, thereby providing the user with positive tactile feedback during user interaction with the user interface of the portable electronic device 20.

The touch-sensitive overlay 34 can be any suitable touch-sensitive surface such as a resistive or a capacitive touch-sensitive surface. Thus, the touch-sensitive overlay 34 includes a number of layers in a stack and is fixed to the display 32 via a suitable optically clear adhesive. It will be appreciated that the layers in the stack are dependent on the type of touch-screen display.

The display device 32 provides graphical representations that are selectable or manipulatable by user interaction with the touch-sensitive overlay 34. In the present example, the X and Y location of a touch event are both determined based on the signals received at the controller 36 from the touch-sensitive overlay 34. It will be appreciated that the location of a user's touch on the touch screen display 38 is determined by determining the X and Y location and user-selected input is determined based on the X and Y location of the touch and the application executed by the processor 22.

The switches 39 provide additional input as actuation of either of the mechanical switches 39 generates a further signal input to the processor 22. The further signal from the actuation of one of the mechanical switches 39 can cause the initiation of commands at the processor 22, either alone or resulting from the combination of the signal from the mechanical switch and signals from the touch sensitive input surface 26. Thus, commands initiated at the processor 40 can be a result of the signal generated from one of the mechanical switches 39 alone or a result of the signal generated from the mechanical switch 39 in combination with signals from the touch sensitive input overlay 34 caused by user interaction. User interaction can be, for example, the user touching the touch-sensitive overlay 34 (or a cover on the touch-sensitive overlay 34) or the user sliding a finger along the touch-sensitive overlay 34. Different sliding actions of the finger along the touch-sensitive overlay 34 can also result in different commands initiated at the processor 22.

Figure 5:
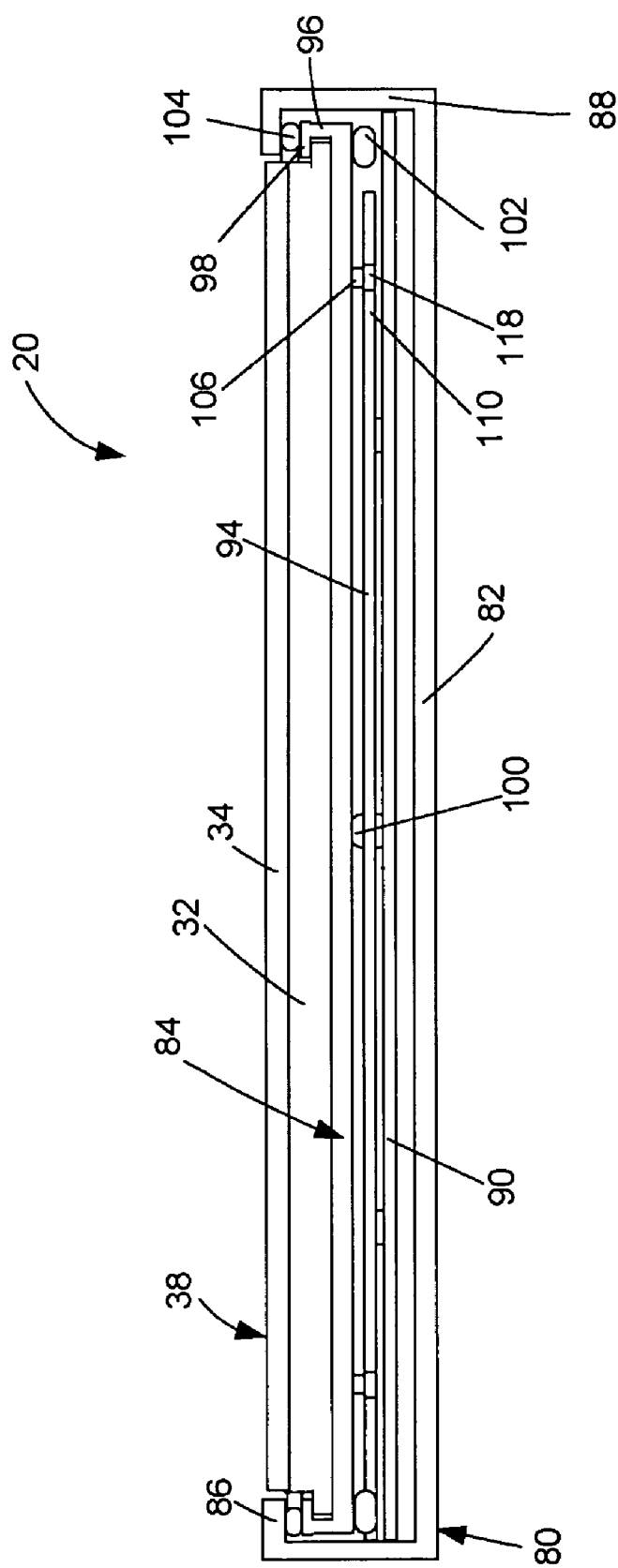
FIG. 5 is a simplified longitudinal sectional side view through locking pins of the portable electronic device of FIG. 2.

Reference is now made to FIGS. 3, 4 and 5 to describe the support tray 84 in further detail. As described, the support tray 84 includes the generally rectangular tray base 94 on which the LCD display device 32 and the touch-sensitive overlay 34 are seated. The support tray 84 is a generally flat tray with locking pins 106 extending from a backside of the tray base 94, toward the base 90. The locking pins 106 can be any suitable shape and can be made of any suitable material. In the present embodiment, the support tray 84 is made of a suitable metal, such as magnesium and the locking pins are formed in the tray base 94. In the present embodiment, there are four locking pins 106, and a respective one of the locking pins 106 extends from the tray base 94, proximal each of the four corners of the tray base 94. The use and function of the locking pins 106 will be described further below. The support tray 84 can also include, for example, actuators 108 for contacting and actuating respective ones of the switches 39 when the portable electronic device 20 is in use. The actuators 108 can also be any suitable shape and can be made of any suitable material. The tray base 94 also includes an opening such as a recessed portion or notch through which connections can be made between the operational components such as the processor 22 and the controller 36, described above with reference to FIG. 1, and the LCD display device 32 and touch-sensitive overlay 34.

As described, the tray sides 96 extend generally perpendicularly away from the tray base 94 for circumscribing the edges of the LCD display device 32 and the touch-sensitive overlay 34. The lip 98 extends inwardly from each of the tray sides 96 for holding the lip gel pads 104 for interacting with the frame 86 of the housing 80. As indicated above, the support tray 84 including the tray base 94, tray sides 96, lip 98, locking pins 106 and actuators 108 can be formed, cast or molded in any suitable manner.

In the present embodiment, six gel pads are disposed on a back side of the support tray 84, distal the tray sides 96 and the lip 98. Of the six gel pads disposed on the back side of the support tray 84, four back side corner gel pads 102 are located near the corners of the support tray 84, with each of the corner gel pads 102 near a respective one of the corners, partially along a short side of the support tray 84, and two pivot gel pads 100 extend inwardly from long sides of the support tray 84, toward the center. The back side corner gel pads 102 and the pivot gel pads 100 have a generally obround cross-section and can be connected to the support tray 84 in any suitable manner such as mechanical interlock with holes in the support tray 84. The pivot gel pads 100 are larger than the back side corner gel pads 102 in that the pivot gel pads 100 extend farther away from the back side of the tray base 94 for contacting the base 90 of the portable electronic device 20.

Six lip gel pads 104 are also disposed on the lip 98 of the support tray 84, extending away from the lip 98 and the tray base 94. The six lip gel pads 104 include four lip gel pads 104 located at and extending around respective corners of the lip 98 and lip gel pads 104 extending along and generally centered on the long sides of the lip 98. The lip gel pads 104 on the lip 98 also have a generally obround cross-section and can be connected to the support tray 84 in any suitable manner such as by mechanical interlock with through-holes in the lip 98. The lip gel pads 104 are small by comparison to the pivot gel pads 100 in that the pivot gel pads 100 extend a greater distance from the support tray 84.

Each of the gel pads 100, 102, 104 acts as a biasing element, providing positive tactile feedback for the user of the device and protecting the LCD display device 32 and the touch-sensitive overlay 34 as the gel pads 100, 102, 104 provide cushioning and dampening for absorbing energy when the touch-sensitive overlay 34 is depressed and for biasing the support tray 84, display device 32 and touch-sensitive overlay 34 into a rest position when the an external force is removed from the touch-sensitive overlay 34.

Figure 6:
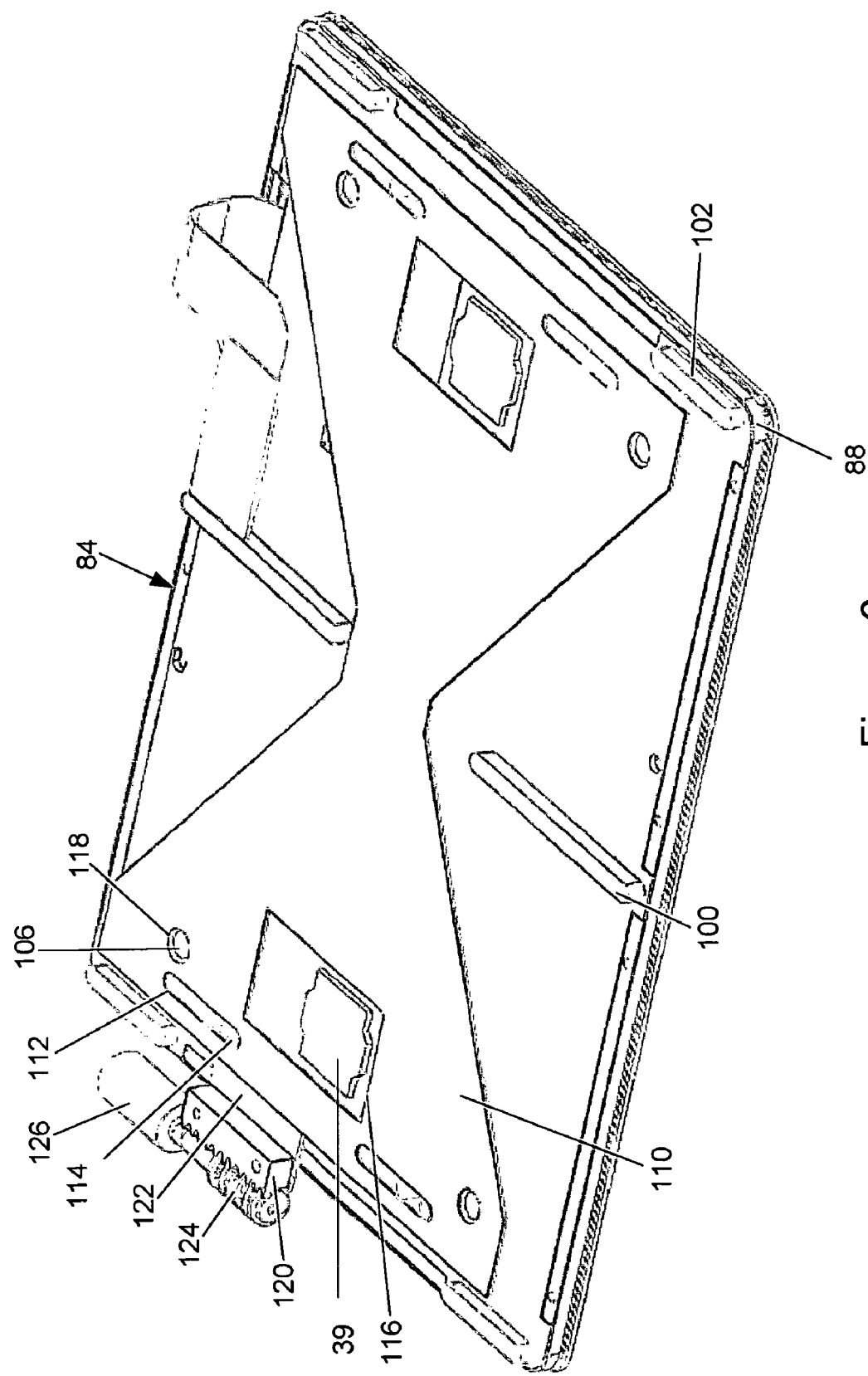
FIG. 6 is a perspective view of the support tray of FIG. 4 including a locking arrangement shown in an unlocked position.
Figure 7:
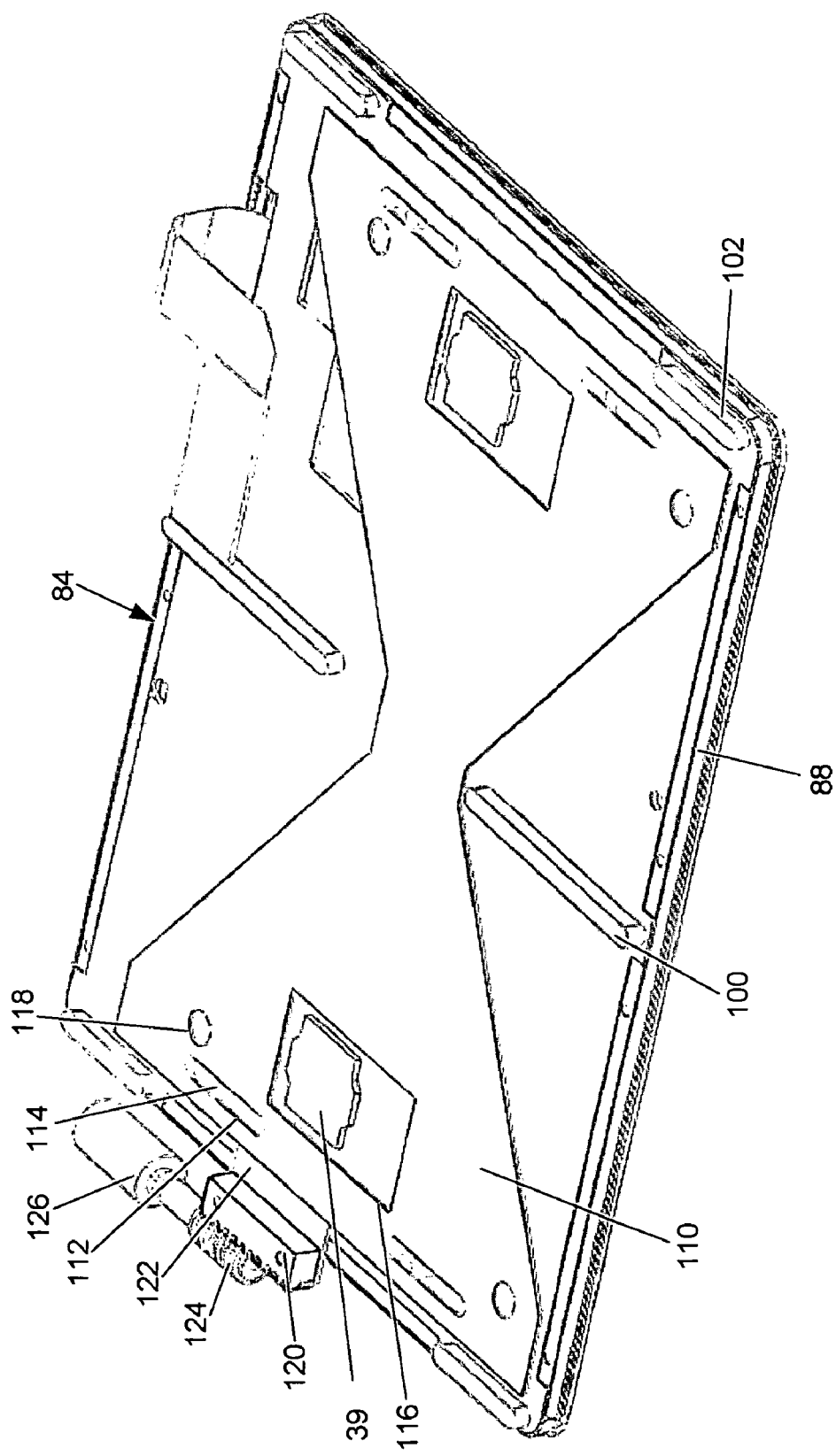
FIG. 7 is a perspective view of the support tray, similar to FIG. 6, with the locking arrangement shown in a locked position.

Reference is now made to FIGS. 6 to 10 to describe the locking arrangement for locking the support tray 84 to inhibit movement relative to the back 82 of the housing 80. According to the present embodiment, the locking arrangement includes a locking plate 110 that has a number of holes, slots and notches therein. The locking plate 110 is located between the tray base 94 and the base 90 of the portable electronic device 20 and is shaped for cooperating with the locking pins 106 extending from the tray base. In the present embodiment, the locking plate is a metal sheet that is shaped in generally hourglass section shape as best shown in FIGS. 6 and 7. The locking plate can be formed, for example, from a rectangular metal sheet with cut-away, generally V-shaped notches along each long side of the rectangular sheet to result in the shape as shown.

The cut-away portions along the long sides provide a clearance from the pivot gel pads 100 so as not to interfere with the pivot gel pads 100 on which the support tray 84 sits. The locking plate 110 is also sized so as not to interfere with the back side corner gel pads 102. Thus, the length of the locking plate 110 is less than the length of the support tray 84.

Figure 8:
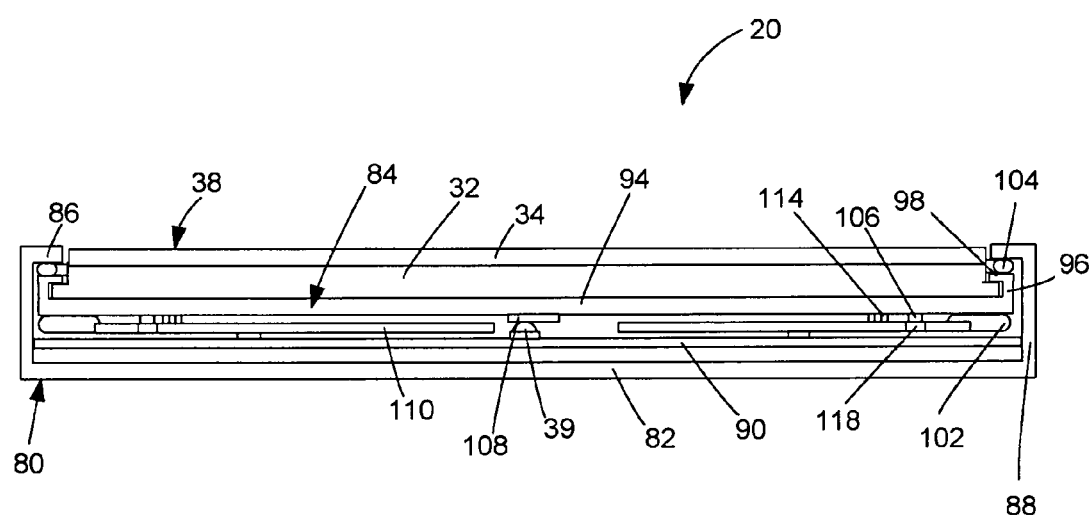
FIG. 8 is a simplified lateral sectional side view through locking pins of the portable electronic device of FIG. 2, with the locking arrangement shown in the unlocked position.
Figure 9:
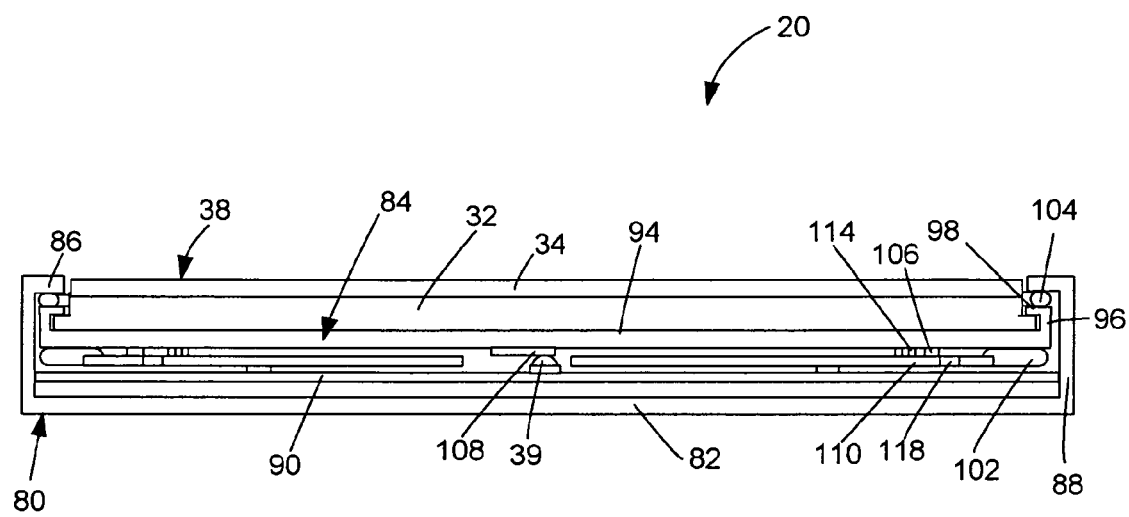
FIG. 9 is a view of the portable electronic device similar to FIG. 8 with the locking arrangement shown in the locked position.
Figure 10:
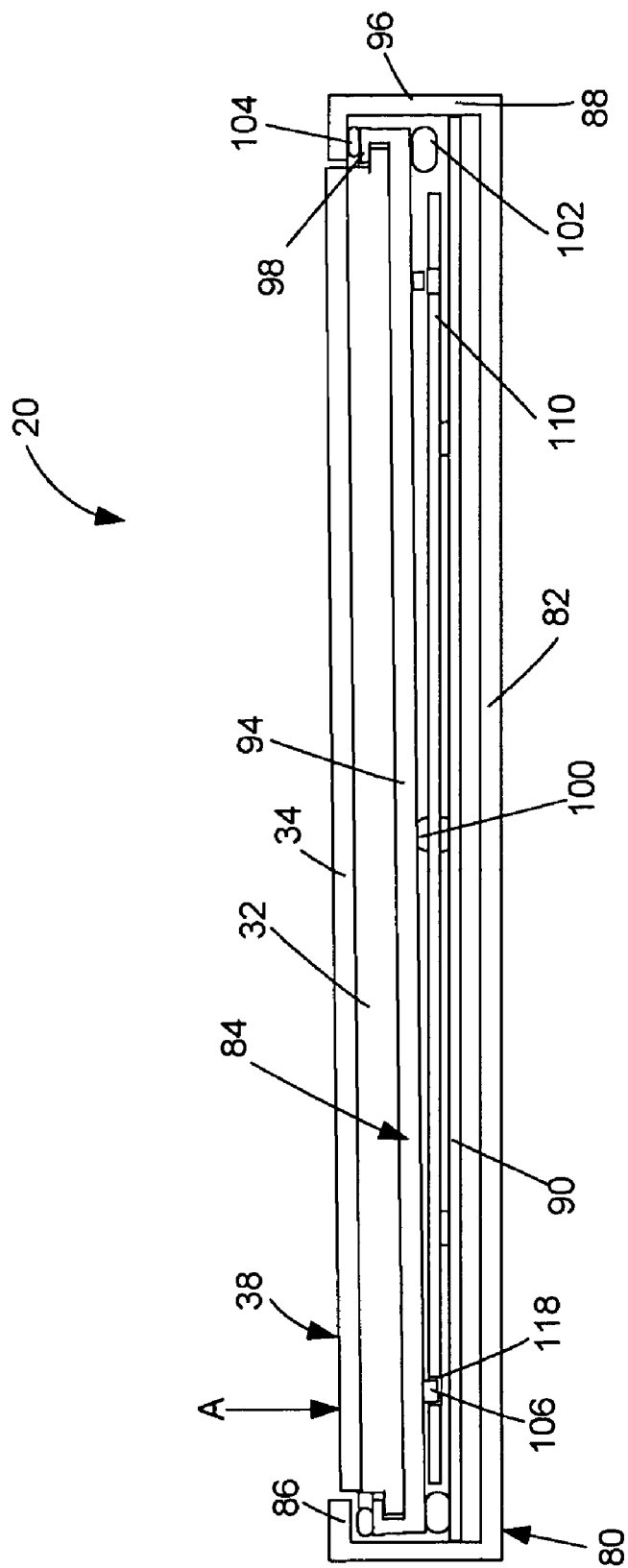
FIG. 10 is a view similar to FIG. 5 with the locking arrangement in the unlocked position and a force applied to one side of the portable electronic device.

A Teflon™ coating or other suitable coating on the locking plate 110 aids in reducing friction and wear resulting from movement of the locking plate 110 between a locked position, shown in FIGS. 7 and 9, in which the support tray 84 is locked to inhibit movement of the support tray 84 relative to the back 82 of the portable electronic device 20 and an unlocked position, shown in FIGS. 6, 8 and 10, in which the support tray 84 is free to pivot about the pivot gel pads 100 in response to application of a force on the touch-sensitive overlay 34, thereby moving relative to the back 82 of the portable electronic device 20 (best shown in FIG. 10).

As indicated above, the locking plate 110 includes a number of holes and slots. A pair of guide slots are provided along each side of the locking plate 110, near the ends of the locking plate 110. The guide slots 112 are generally obround in shape and extend in the direction of movement of the locking plate 110 when moving between the locked position and the unlocked position. The guide slots 112 are each located to receive a respective pair of guide pins 114 that extend from the support tray 84.

The guide pins 114 are sized and located to fit into the guide slots 112, with two guide pins 114 in each respective one of the guide slots 112, to guide the movement of the locking plate 110 between the locked position and the unlocked position. To reduce friction, the guide pins can be made of suitable material such as nylon or Delrin™ and are connected to the support tray 84 in any suitable manner, such as by suitable mechanical connection. Thus, when the locking plate 110 moves between the locked position (FIG. 7) and the unlocked position (FIG. 6), each of the guide slots 112 travels along a respective pair of guide pins 114. The movement of the locking plate 110 is therefore guided.

To accommodate each of the actuators 108 and the respective switches 39, a respective rectangular slot 116 is provided on each side of the locking plate 110. Each rectangular slot 116 is sufficiently sized to provide clearance around the actuators 108 and the switches 39 when the locking plate 110 is in and when traveling between the locked position and the unlocked position. Thus, the locking plate 110 does not interfere with the actuators 108 or with the switches 39 and each of the switches 39 can be actuated by a respective one of the actuators 108 as a result of pivoting of the support tray 84 about the pivot gel pads 100 when the locking plate 110 is in the unlocked position.

Four lock pin holes 118 extend through the locking plate 110 with each one of the four lock pin holes 118 sized and located to receive a respective one of the four locking pins 106 when the locking plate 110 is in the unlocked position shown in FIGS. 6, 8 and 10. Thus, each one of the lock pin holes 118 is larger in diameter than the respective one of the locking pins 106 and is located in the locking plate 110, proximal a respective one of the four corners of the tray base 94. As indicated, when the locking plate 110 is in the unlocked position, each of the four lock pin holes 118 is located to receive a respective one of the locking pins 106. When a force is applied to the touch-sensitive overlay sufficient to overcome the bias and cause pivoting of the support tray 84 along with the touch-sensitive overlay 34 and the display device 32, the two locking pins 106 on one side of the support tray 84 that is moved toward the base 90 are received in respective ones of the lock pin holes 118 as best shown in the longitudinal sectional view of FIG. 10. It will be appreciated that if a force is applied to the touch-sensitive overlay sufficient to overcome the bias and cause the support tray 84 along with the touch-sensitive overlay 34 and the display device 32 to pivot in the opposite direction, such that the other side of the support tray 84 is moved toward the base 90, the other two locking pins 106 on the other side of the support tray are received in the respective other ones of the lock pin holes 118. For the support tray 84 to pivot on the gel pivot pads 100 a sufficient amount to cause actuation of one of the switches 39, the locking pins 106 on the same side of the support tray 84 as the one of the switches, must be received in the respective lock pin holes 118.

When the locking plate 110 is in the locked position, the lock pin holes 118 are not aligned with the locking pins 106 and thus, the locking pins 106 are not received in the lock pin holes 118, as best shown in FIGS. 7 and 9. Thus, when a force is applied to one side of the touch-sensitive overlay, the two locking pins 106 on the same side of the support tray 84 abut the locking plate 110, inhibiting movement of the support tray 84 and inhibiting actuating of either one of the switches 39.

One side of the locking plate 110 is connected to a gear rack 120 by an intermediary arm 122. A complementary worm gear 124 cooperates with the gear rack 120 and is driven by a motor 126 that is fixed to the housing of the portable electronic device 20 and is connected to and controlled by the processor 20. It will be appreciated that the processor 20 controls the motor 126 for controlling driving of the worm gear 124, thereby controlling the movement of the locking plate 110 between the locked position and the unlocked position.

In the present embodiment, movement of the locking plate from the locked position to the unlocked position can be toggled by depression of a virtual button or buttons on the touch screen display 38. Similarly, movement of the locking plate 110 from the unlocked position to the locked position can be effectuated by depression of a virtual button or buttons on the touch screen display 38. It will be appreciated that rather than the movement of the locking plate being effectuated by depression of a virtual button or buttons, a button can be provided, for example, on a side of the portable electronic device 20.

Reference is now made to FIGS. 5 and 10 to describe movement of the support tray 84 along with the touch-sensitive overlay 34 and the display device 32 within the housing 80 of the portable electronic device 20. FIG. 5 shows a simplified longitudinal sectional side view of the portable electronic device 20 through the locking pins 106, according to one embodiment in which the support tray 84, display device 32 and touch-sensitive overlay 34 are in the rest position absent an externally applied force. FIG. 10 shows a simplified longitudinal sectional side view of portions of the portable electronic device 20 through the locking pins 106, according to one embodiment in which a force is applied by, for example, a user pressing a finger into the touch screen display 38 in the direction of the arrow "A". As shown, the user presses on the side of the touch-sensitive overlay 34, resulting in pivoting of the support tray 84 on the pivot gel pads 100 such that the back side corner gel pads 102 that are on the same side of the portable electronic device 20 on which the force is applied are compressed between the tray base 94 and the base 90. The lip corner gel pads 134 on the opposite side of the pivot gel pads 100 are compressed between the lip 98 and the frame 86. Thus, the support tray 84 pivots and one of the actuators 108 (shown in FIG. 3) actuates a respective one of the mechanical switches 39 (shown in FIG. 3) on the same side of the portable electronic device 20 to which the force is applied. Referring to FIG. 10, the locking pins 106 on the same side of the portable electronic device 20 are received in the respective lock pin holes 118, thereby permitting the pivoting such that the one of the actuators 108 actuates the respective one of the mechanical switches 39. When the force on the touch screen display 38 is removed, the touch screen display 38 is biased by the gel pads into the rest position shown in FIGS. 3 and 5, with the tray base 94 generally parallel with the base 90 of the portable electronic device 20.

Referring to FIGS. 6 to 9, when a lock command is received at the processor 22 as a result of user-selection of a virtual button on the touch screen display 38 for locking the support tray 84 along with the touch-sensitive overlay 34 and the display device 32, the motor 126 is energized such that the worm gear 124 is driven in the direction to move the gear rack 120 resulting in movement of the locking plate 110 into the locked position (shown in FIGS. 7 and 9).

As indicated above, the lock pin holes 118 are not aligned with the locking pins 106 when the locking plate 110 is in the locked position. Thus, when a force is applied to one side of the touch-sensitive overlay, the two locking pins 106 on the same side of the support tray 84 abut the locking plate 110, inhibiting movement of the support tray 84 and inhibiting actuation of the switches 39.

When an unlock command is received at the processor 22 as a result of user-selection of a virtual button on the touch screen display 38 for unlocking the support tray 84, the motor 126 is energized such that the worm gear 124 is driven in the opposite direction to move the gear rack 120 such that the locking plate 110 is moved into the unlocked position (shown in FIGS. 6 and 8).

Figure 11:
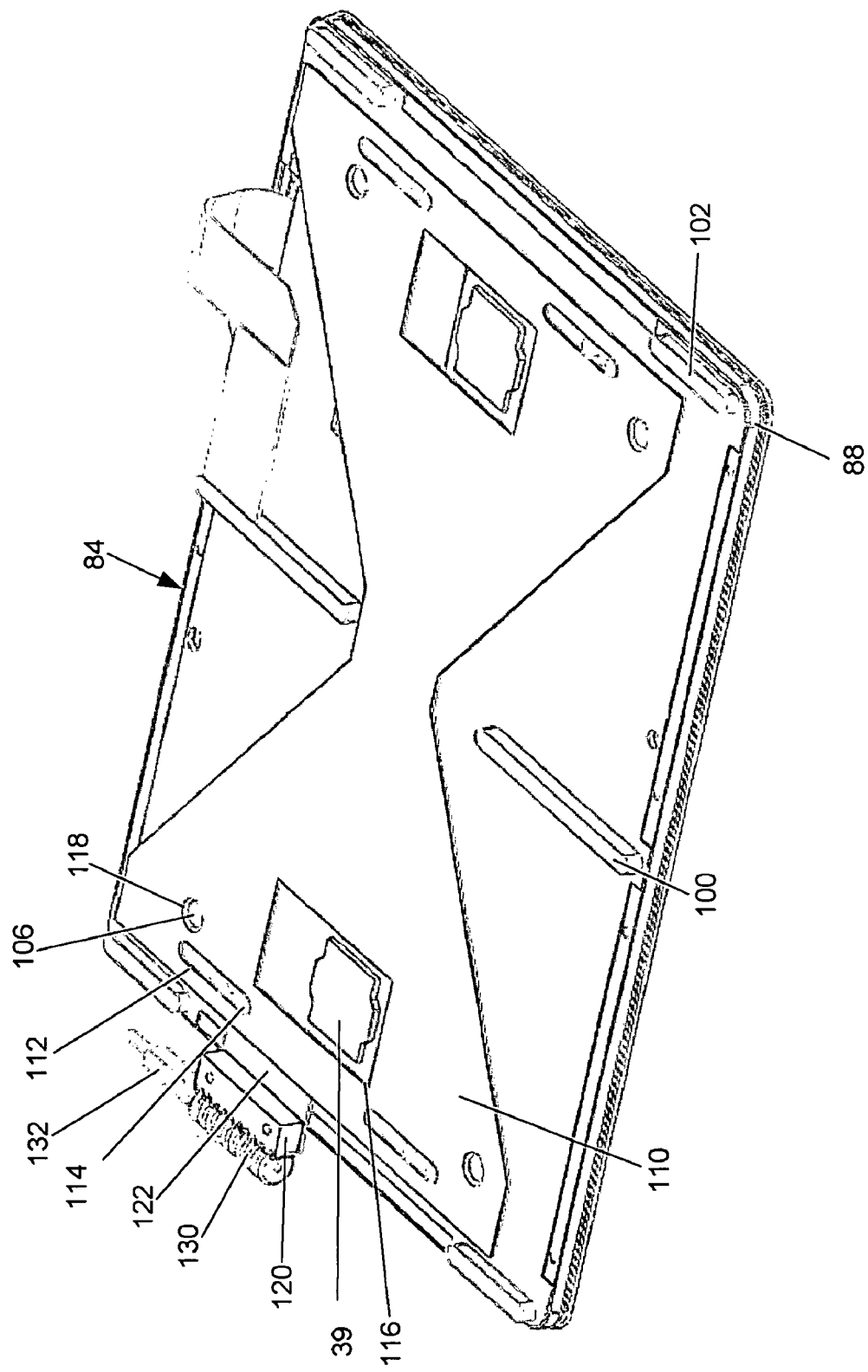
FIG. 11 is a perspective view of a support tray including a locking arrangement according to another embodiment, the locking arrangement shown in an unlocked position.
Figure 12:
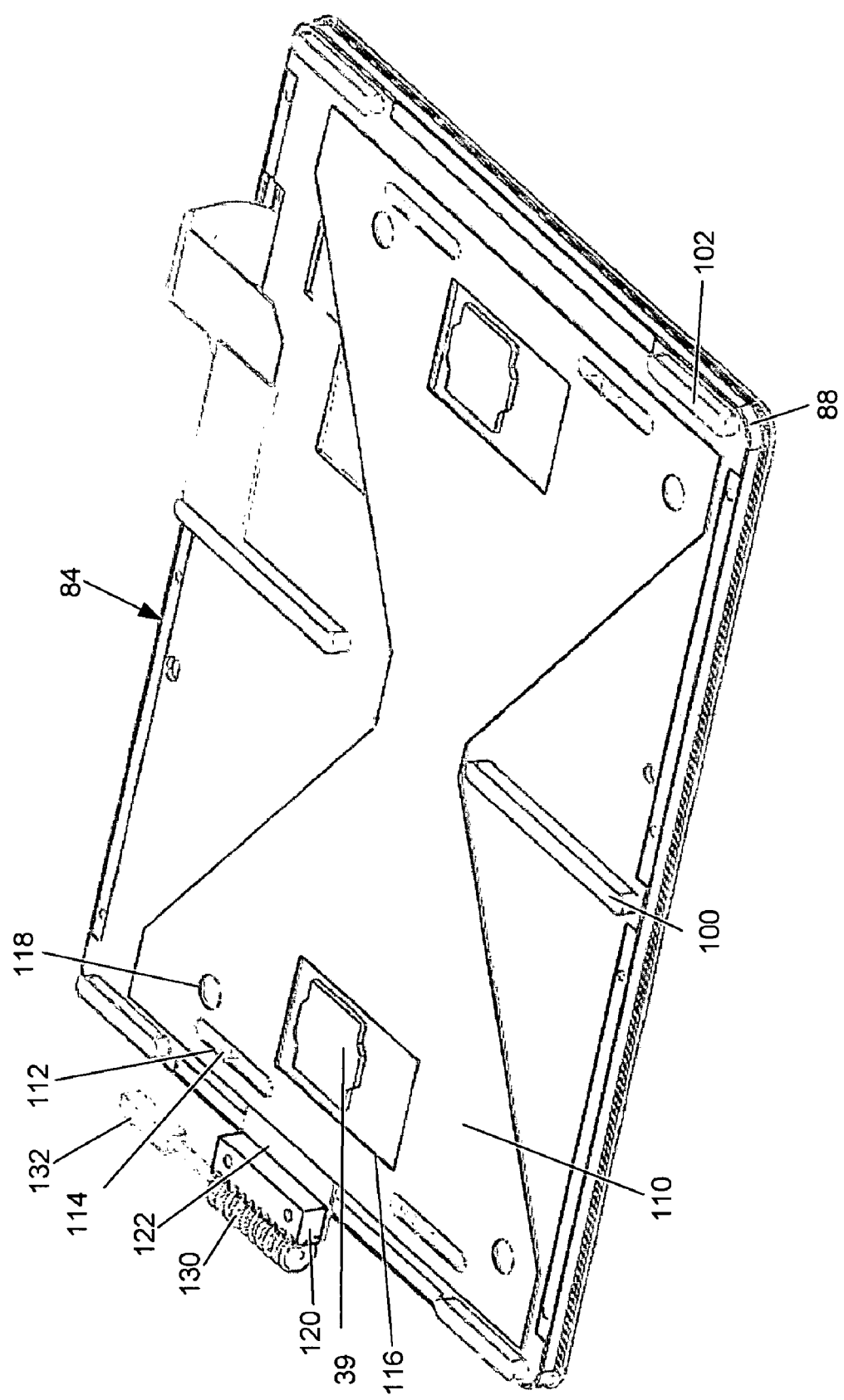
FIG. 12 is a perspective view of the support tray including the locking arrangement of FIG. 11, the locking arrangement shown in a locked position.

Reference is now made to FIGS. 11 and 12 which show a locking arrangement for a portable electronic device according to another embodiment. The locking arrangement according to the present embodiment is similar to the locking arrangement of the above-described embodiment, with the exception that a spool 130 cooperates with the gear rack 120 rather than the complementary worm gear. The motor that drives the spool 130 is a piezoelectric motor 132 that rotates and translates the spool 130 to cause movement of the gear rack 120 resulting in movement of the locking plate 110 from the unlocked position shown in FIG. 11 to the locked position shown in FIG. 12 or from the locked position to the unlocked position. The remainder of the features and the operation of the locking arrangement are similar to those described above and are therefore not further described herein.

The moveable support tray 84 along with the display device 32 and the touch-sensitive overlay 34 provides for a tactile feedback to the user when interacting with the touch-screen display 38 by, for example, depressing virtual buttons on the touch screen display 38. The switches 39 provide desirable tactile feedback as the clicking sound and feel provides a positive indication of selection of the virtual button, for example. Further, the switches 39 can provide further input. In some instances, such movement of the support tray 84 along with the display device 32 and the touch-sensitive overlay 34 may be undesirable, however. For example, a user employing the voice communications functions of the portable electronic device 20 can inadvertently press on the touch-sensitive overlay 34 by pressing the portable electronic device 20 against his or her face or by inadvertently pressing with a finger. In this case, the actuation of a switch 39 providing the clicking sound and feel is undesirable as it may be distracting to the user and to the person engaged in voice communications with the user. The locking arrangement permits locking of the support tray 84 to inhibit movement thereby inhibiting actuation of the switches 39. Thus, the movement of the support tray 84 along with the display device 32 and the touch-sensitive overlay 34 can be selectively locked or unlocked, thereby selectively enabling or disabling pivoting and the resulting actuation of the switches 39. The selective locking and unlocking reduces unwanted noise resulting from the actuation of switches and aids in reducing erroneous input to the portable electronic device.

According to one aspect, there is provided a touch screen display assembly for use in an electronic device. The touch screen display assembly includes a housing having a back, a support tray moveable relative to the back of the housing, a touch-sensitive display supported by the support tray and moveable with the support tray relative to the back of the housing, the touch-sensitive display including a display device and a touch-sensitive overlay disposed on the display device, and a locking arrangement cooperating with the support tray for locking the support tray and touch-sensitive display to inhibit movement of the support tray relative to the back of the housing.

According to another aspect, there is provided an electronic device. The electronic device includes a housing having a back, a support tray moveable relative to the back of the housing, a touch-sensitive display supported by the support tray and moveable with the support tray relative to the back of the housing, the touch-sensitive display including a display device and a touch-sensitive overlay disposed on the display device, a locking arrangement cooperating with the support tray for locking the support tray and touch-sensitive display to inhibit movement of the support tray relative to the back of the housing, and operational components housed in the housing and including a touch screen controller connected to the touch-sensitive overlay and a processor connected to the display device and the touch-screen controller.

While the embodiments described herein are directed to particular implementations of the touch screen display and the portable electronic device, it will be understood that modifications and variations to these embodiments are within the scope and sphere of the present disclosure. Also, the Figures depict examples of the portable electronic device and other shapes and configurations are possible. It will be appreciated that the size and shape of many of the features can differ while still providing the same function. It will also be appreciated that similar functions can be carried out in alternative embodiments. For example, the guide pins are described in the above examples as extending from the support tray. Alternatively, the guide pins can extend from the base, for example.

Many other modifications and variations may occur to those skilled in the art. All such modifications and variations are believed to be within the sphere and scope of the present disclosure.

What is claimed is:

1. A touch screen display assembly for use in an electronic device, the touch screen display assembly comprising:
   a housing comprising a back;
   a support tray moveable relative to the back of the housing;
   a touch-sensitive display supported by the support tray and moveable with the support tray relative to the back of the housing, the touch-sensitive display including a display device and a touch-sensitive overlay disposed on the display device; and
   a locking arrangement having a locking plate disposed between the support tray and the back, the locking plate moveable between a locked position for locking the support tray and an unlocked position in which the support tray is moveable relative to the back of the housing.

2. The touch screen display assembly according to claim 1, wherein the locking arrangement comprises guides for guiding movement of the locking plate between the locked position and the unlocked position.

3. The touch screen display assembly according to claim 2, wherein the guides comprise guide pins extending through guide slots in the locking plate from one of the support tray and the back.

4. The touch screen display assembly according to claim 3, wherein the guide pins comprise a pair of guide pins proximal a respective one of each of four corners, each pair of guide pins extending through one of the guide slots in the locking plate.

5. The touch screen display assembly according to claim 2, wherein the locking arrangement comprises a motor cooperating with the locking plate for moving the locking plate between the locked position and the unlocked position.

6. The touch screen display assembly according to claim 2, wherein the locking arrangement comprises locking pins extending from the support tray arranged for moving towards the back when the locking plate is in the unlocked position and for abutting the locking plate when the locking plate is in the locked position.

7. The touch screen display assembly according to claim 6, wherein the locking plate comprises holes located in alignment with the locking pins when the locking plate is in the unlocked position.

8. The touch screen display assembly according to claim 7, wherein ones of the locking pins extend through respective ones of the holes when the support tray and the touch-sensitive display are moved toward the back.

9. The touch screen display assembly according to claim 8, wherein the locking pins comprise a locking pin proximal a respective one of each of four corners and the holes comprise corresponding holes in the support tray.

10. The touch screen display assembly according to claim 2, wherein the support tray and the touch-sensitive display are pivotable relative to the back when the locking plate is in the unlocked position.

11. The touch screen display assembly according to claim 10, comprising at least one pivot pad disposed between the back and the support tray about which the support tray is pivotable when the locking plate is in the unlocked position.

12. The touch screen display assembly according to claim 10, comprising at least one switch disposed between the back and the support tray for actuating in response to pivoting of the support tray and the touch-sensitive display.

13. The touch screen display assembly according to claim 12, wherein the support tray is biased away from the back.

14. An electronic device comprising:
   a housing comprising a back;
   a support tray moveable relative to the back of the housing;
   a touch-sensitive display supported by the support tray and moveable with the support tray relative to the back of the housing, the touch-sensitive display including a display device and a touch-sensitive overlay disposed on the display device;
   a locking arrangement having a locking plate disposed between the support tray and the back, the locking plate moveable between a locked position for locking the support tray and an unlocked position in which the support tray is moveable relative to the back of the housing; and operational components housed in the housing and comprising a touch screen controller connected to the touch-sensitive overlay and a processor connected to the display device and the touch-screen controller.

15. The electronic device according to claim 14, wherein the locking arrangement comprises guides for guiding movement of the locking plate between the locked position and the unlocked position.

16. The electronic device according to claim 15, wherein the guides comprise guide pins extending through guide slots in the locking plate from one of the support tray and back.

17. The electronic device according to claim 16, wherein the guides comprise guide pins extending from the back through guide slots in the locking plate.

18. The electronic device according to claim 17, wherein the guide pins comprise a pair of guide pins proximal a respective one of each of four corners, each pair of guide pins extending through one of the guide slots in the locking plate.

19. The electronic device according to claim 14, wherein the locking arrangement comprises a motor cooperating with the locking plate for moving the locking plate between the locked position and the unlocked position.

20. The electronic device according to claim 14, wherein the locking arrangement comprises locking pins extending from the support tray arranged for moving towards the back when the locking plate is in the unlocked position and for abutting the locking plate when the locking plate is in the locked position.

21. The electronic device according to claim 20, wherein the locking plate comprises holes located in alignment with the locking pins when the locking plate is in the unlocked position.

22. The electronic device according to claim 21, wherein ones of the locking pins extend through respective ones of the holes when the support tray and the touch-sensitive display are moved toward the back.

23. The electronic device according to claim 14, wherein the support tray and the touch-sensitive display are pivotable relative to the back when the locking plate is in the unlocked position.

24. The electronic device according to claim 23, comprising at least one pivot pad disposed between the back and the support tray about which the support tray is pivotable when the locking plate is in the unlocked position.

25. The electronic device according to claim 23, comprising at least one switch disposed between the back and the support tray for actuating in response to pivoting of the support tray and the touch-sensitive display.

26. The electronic device according to claim 25, wherein the support tray is biased away from the back.

27. The electronic device according to claim 14, wherein the processor is connected to the locking arrangement for moving the locking plate into the locked position in response to receipt of a lock command at the processor and for moving the locking plate into the unlocked position in response to receipt of an unlock command at the processor.

* * * * *